(12) United States Patent
Liu

(10) Patent No.: US 8,119,931 B1
(45) Date of Patent: Feb. 21, 2012

(54) DIFFERENTIAL VERTICAL STRUCTURE FOR HIGH DENSITY, LOW LAYER COUNT PACKAGES

(75) Inventor: Hui Liu, Pleasanton, CA (US)

(73) Assignee: Altera Corporation, San Jose, CA (US)

( * ) Notice: Subject to any disclaimer, the term of this patent is extended or adjusted under 35 U.S.C. 154(b) by 364 days.

(21) Appl. No.: 12/395,424

(22) Filed: Feb. 27, 2009

(51) Int. Cl.
*H05K 1/11* (2006.01)
(52) U.S. Cl. .......................................... 174/262
(58) Field of Classification Search .......... 174/260–262; 361/792–795
See application file for complete search history.

(56) References Cited

U.S. PATENT DOCUMENTS

| | | | | |
|---|---|---|---|---|
| 7,435,624 B2 * | 10/2008 | Chiu et al. | | 438/123 |
| 2007/0252254 A1 * | 11/2007 | Chiu et al. | | 257/678 |
| 2007/0254407 A1 * | 11/2007 | Chiu et al. | | 438/111 |

* cited by examiner

*Primary Examiner* — Javaid Nasri
(74) *Attorney, Agent, or Firm* — Womble Carlyle Sandridge & Rice, LLP

(57) ABSTRACT

A multilayer substrate minimizing differential loss is presented. The multilayer substrate for providing signals between an integrated circuit and a printed circuit board consists of a number of alternating electrically conductive and insulating layers. Differential signals are routed through the core insulating layer using differential pairs of plated through holes (PTHs). In addition, the multilayer substrate includes a number of plated through holes, which provide ground signals between conductive layers separated by the core layer. The multilayer substrate is configured such that a PTH providing ground is situated between each differential pair of plated ground holes, where the center or axis of each plated through hole is aligned in a collinear configuration.

20 Claims, 7 Drawing Sheets

DIFFERENTIAL VERTICAL STRUCTURE FOR HIGH DENSITY, LOW LAYER COUNT PACKAGES

BACKGROUND

Many circuit packages which operate at high frequencies are implemented using multilayer substrates with a relatively small number of layers and high density routing for cost reasons. Performance degradation associated with differential loss and cross-talk is major problem especially prevalent with low layer count substrates with high density routing. Mismatches in impedance between components of the vertical structure carrying differential signals directly leads to differential loss, while cross-talk is strongly related to the separation between differential pairs. For these multilayer substrates, having closely packed differential signal pairs is unavoidable and the close proximity of differential pairs to each other is a major contributor to cross-talk. On the other hand, spacing out pairs of signal traces carrying the differential signals to reduce cross-talk in turn reduces the transition space available to achieve target differential impedance.

A configuration commonly used in low layer count substrates with high density routing has two differential plated through holes (PTHs) and one ground PTH aligned in a triangle configuration. The triangle configuration can not achieve the target differential impedance because of the proximity of the differential pair of PHTs to each other such that differential loss performance is significantly degraded. In addition, conductive material directly above the differential plated through holes or above the differential solder balls may couple with either the PTHs or solder balls. This coupling affects the differential impedance of the signal carried through the PTHs or solder balls.

It is in this context that embodiments of the invention arise.

SUMMARY

Broadly speaking, the present invention fills these needs by providing a method and apparatus for minimizing differential loss and cross-talk in a multilayer substrate. It should be appreciated that the present invention can be implemented in numerous ways, including as a method, a system, or a device. Several inventive embodiments of the present invention are described below.

In accordance with one aspect of the invention, a multilayer substrate minimizing differential loss is detailed. The multilayer substrate for providing signals between an integrated circuit and a printed circuit board consists of a number of alternating electrically conductive and insulating layers. Differential signals are routed through the core insulating layer using differential pairs of plated through holes (PTHs). In addition, the multilayer substrate includes a number of plated through holes, which provide ground signals between conductive layers separated by the core layer. The multilayer substrate is configured such that a PTH providing ground is situated between each differential pair of plated ground holes, where the center or axis of each plated through hole is aligned in a collinear configuration.

In accordance with another aspect of the invention, a process for fabricating a multilayer substrate is provided. A number of differential pairs of plated through holes for providing differential signals between conductive layers separated by a core electrically insulating layer are placed in the multilayer substrate. Additionally, a number of plated through holes for providing a ground signal between the conductive layers separated by a core insulating layer are distributed on the substrate. The PTHs are configured with a plated through hole providing the ground signal collinear with each differential pair of plated through holes. In addition, the center regions of differential pairs of plated through holes are aligned in linear fashion with the center region of a corresponding solder ball providing signal routing between the substrate and a printed circuit board.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings.

DETAILED DESCRIPTION

The following embodiments describe an apparatus and method for minimizing differential loss and cross-talk in a multilayer substrate. It will be obvious, however, to one skilled in the art, that the present invention may be practiced without some or all of these specific details. In other instances, well known process operations have not been described in detail in order not to unnecessarily obscure the present invention.

It is highly desirable to have a vertical structure implemented in a low layer count substrate with high density routing, which can simultaneously minimize vertical differential loss and facilitate easier horizontal routing, thereby minimizing cross-talk. Minimizing the differential loss and cross-talk is especially critical in applications which use high-speed signals, such as high-speed transceivers. In embodiments described below, configurations are provided which improve both electrical performance and package routability.

Figure 1:
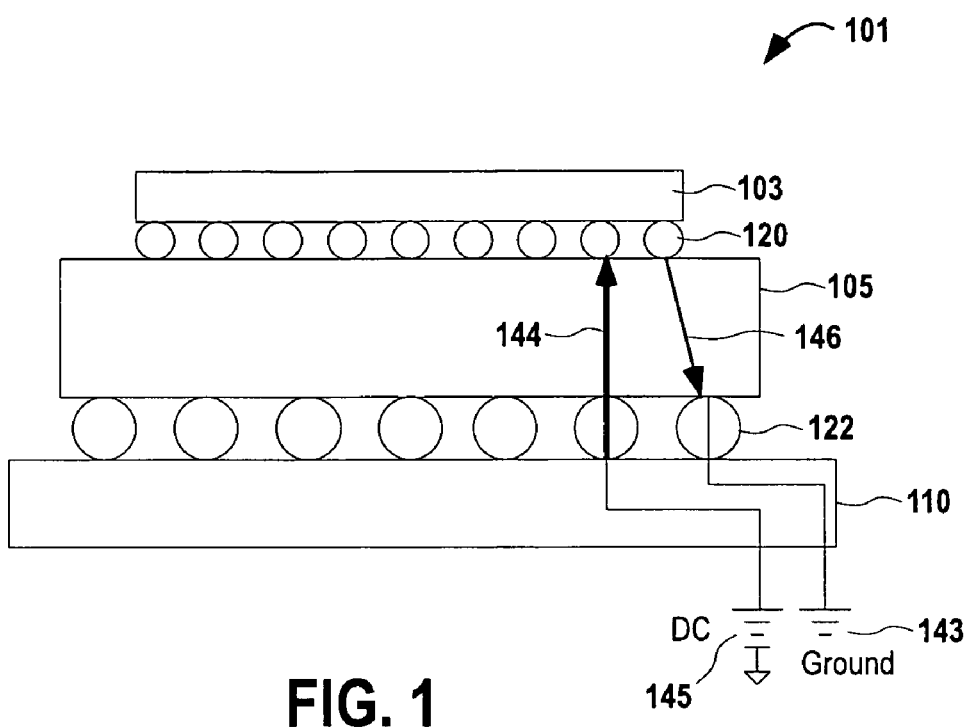
FIG. 1 illustrates a cross section of a circuit package having a multilayer substrate in accordance with one embodiment of the present invention.

FIG. 1 illustrates a cross section of a circuit package having a multilayer substrate in accordance with one embodiment of the present invention. The circuit package 101 includes an integrated circuit (IC) 103, a multilayer substrate 105 for the integrated circuit 103, a printed circuit board (PCB) 110, IC bump grid array 120, and solder ball grid array (BGA) 122. Integrated circuit 103 is a semiconductor chip, such as a microprocessor, field programmable gate arrays (FPGAs), application specific integrated circuits (ASICs), flash memories, and complex programmable logic devices (CPLDs). The multilayer substrate 105 provides communication between the integrated circuit 103 and the printed circuit board 110 through the IC bump grid array 120 and the array of solder balls 122. In one embodiment, a direct current (DC) power supply 145 and a ground 143 are provided to the integrated circuit 103 through the PCB 110. The DC power supply 145 provides a supply voltage to the integrated circuit 103 to activate a device on the integrated circuit 103 through a power path 144. The electric flow generated by the activated device on the integrated circuit 103 is grounded through a return path 146.

FIG. 1 illustrates a particular embodiment of the present invention where the integrated circuit 103 is in electrical communication with the multilayer substrate 105 through an IC bump grid array 120. The embodiment uses an IC bump grid array 120 to provide electrical communication between the integrated circuit 103 and the multilayer substrate 105 is provided for illustrative purposes, and is not meant to limit the present invention to a particular vehicle for providing electrical communication between the multilayer substrate 105 and the integrated circuit 103. In another embodiment, a number of bond wires originating from the integrated circuit 103 to the surface of the multilayer substrate 105 provides electrical communication between the integrated circuit 103 and the multilayer substrate 105.

Figure 2:
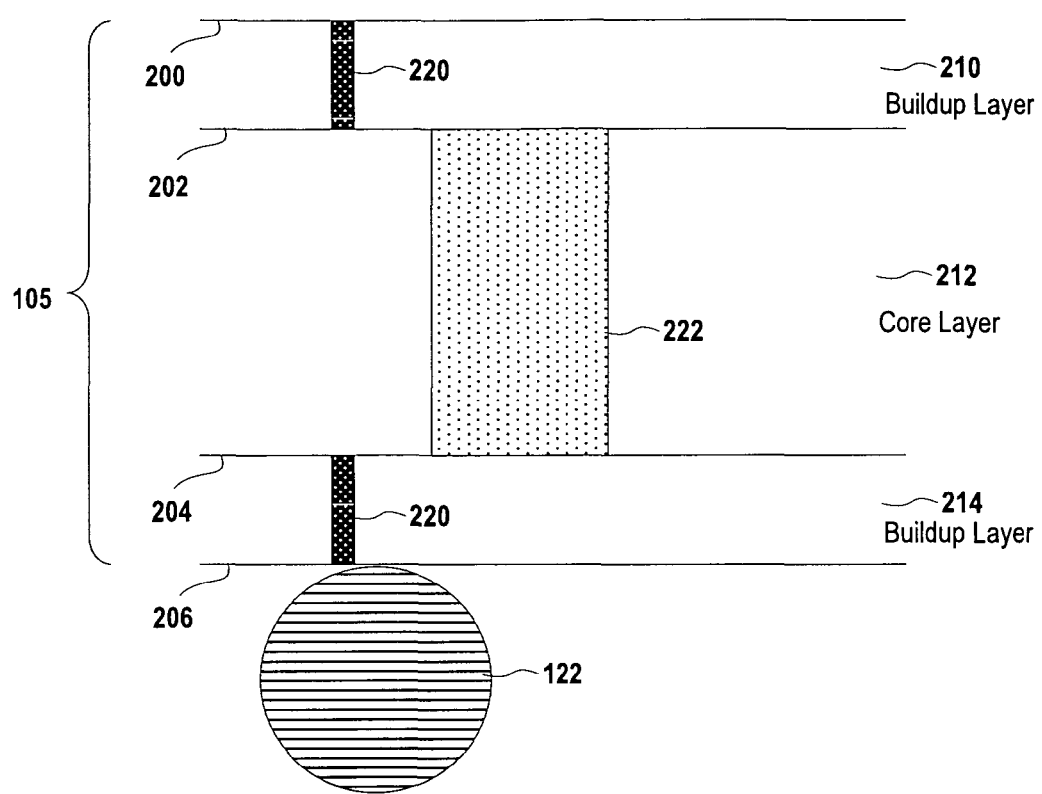
FIG. 2 illustrates a cross section of a multilayer substrate in accordance with one embodiment of the present invention.

FIG. 2 illustrates a cross section of a multilayer substrate in accordance with one embodiment of the present invention. For the purpose of clarity, only a single plated through hole (PTH) 222 and corresponding micro-vias 220 are shown. In addition, the relative thicknesses of the various layers are not drawn to scale. The multilayer substrate 105 consists of alternating electrically conductive and insulating layers. In one embodiment, the multilayer substrate 105 consists of four conducting layers and three insulating layers. Between the first conducting layer 200 and the second conducting layer 202 is an insulating buildup layer 210. A core insulating layer 212 may be used to separate the second conducting layer 202 from the third conducting layer 204. Between the third conductive layer 204 and the fourth conducting layer 206 is an additional buildup layer 214. In one embodiment, the thickness for the core insulating layer 212 is 800 μm and for each buildup insulating layer 210 and 214 is 35 μm. The exemplary thicknesses of the core layer 212 and the buildup layer 210 and 214 are for illustrative purposes and are not meant to be limiting.

In another embodiment, in a four conducting layer substrate 105, the first conducting layer 200 is used for routing of signals between the integrated circuit and the multilayer substrate 105. The second conducting layer 202 serves as the ground plane for the substrate 105, with the third conducting layer 204 providing power to the integrated circuit. The fourth conducting layer 206 is the board attachment layer where the signals between the multilayer substrate 105 and the solder ball array 122 are routed. This embodiment of a four layer substrate 105 is used for illustrative purposes, and does not limit the present invention to a particular number of conductive and insulating layers.

The vertical structure of the multilayer substrate 105 includes a number of micro-vias 220, plated through holes 222, and the solder ball array 122. The PTHs 222 provide electrical communication between signal routing on the second conducting layer 202 and the third conducting layer 204. Plated through holes 222 can be configured into differential pairs for providing differential signals between the second conductive layer 202 and the third conductive layer 204. Other plated through holes 222 may be used to provide a ground signal from the second 202 to the third conductive layers 204. Micro-vias 220 provide electrical communication between signal routing on two conductive layers separated by the buildup insulating layer 210 and 212.

Figure 3:
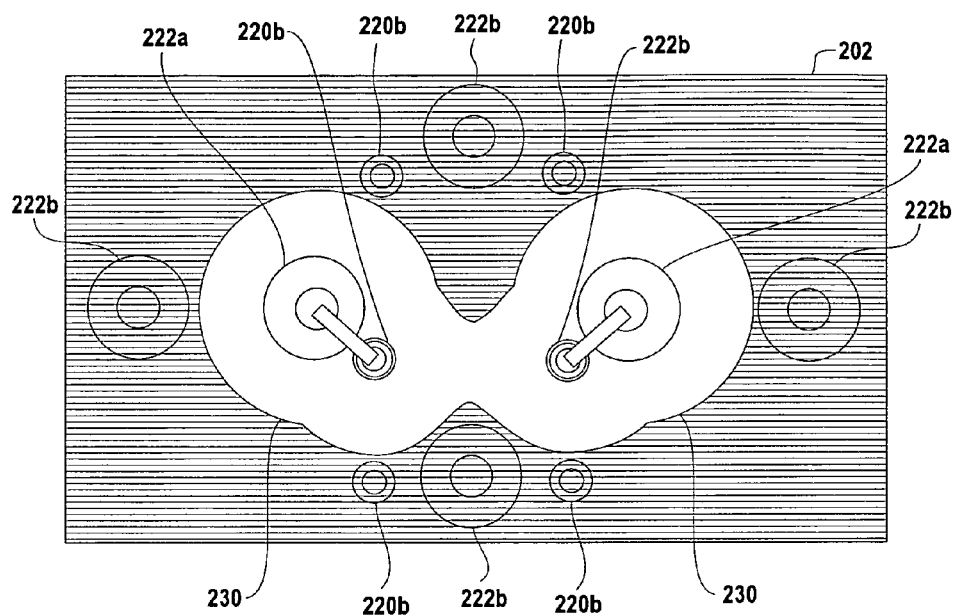
FIG. 3 illustrates a top view of a second conducting layer of a multilayer substrate with a diamond configuration in accordance with one embodiment of the present invention.

FIG. 3 illustrates a top view of a second conducting layer of a multilayer substrate with a diamond configuration in accordance with one embodiment of the present invention. Typically differential signals from the integrated circuit are transmitted through the multilayer substrate using differential pairs of plated through holes 222a with corresponding micro-vias 220a. Ground would be provided to the integrated circuit through plated through holes designated to provide ground 222b and corresponding micro-vias 220b.

One configuration, as shown on the second conducting layer 202 of the multilayer substrate, which addresses the need to minimize differential loss and cross-talk, spaces out each PTH of the differential signal pair 222a. Four plated through holes providing ground 222b surround the differential pair of PTHs 222a on four sides, forming a diamond configuration. For signal routing through the multilayer substrate, having a large spacing of the differential pair of plated through holes 222a reduces the cross talk associated with each differential pair of PTHs 222a.

An additional feature which improves addresses the problems with achieving the target differential loss is the creation of a clearance area 230, which is free of conductive material, within a conductive layer directly above the differential pair of plated through holes 222a. In one embodiment, the clearance area 230 encompasses the horizontal area defined by each of the differential pair of PTHs 222a and their corresponding micro-vias 222b. The diamond configuration utilizes a relatively large amount routing space, which can lead to signal routing for one set of differential signals crossing into the clearance area 230 for another set of differential signals. The crossing of signal routing over a clearance area 230 leads to coupling to the plated through hole 222a underneath causing cross-talk problems.

Figure 4:
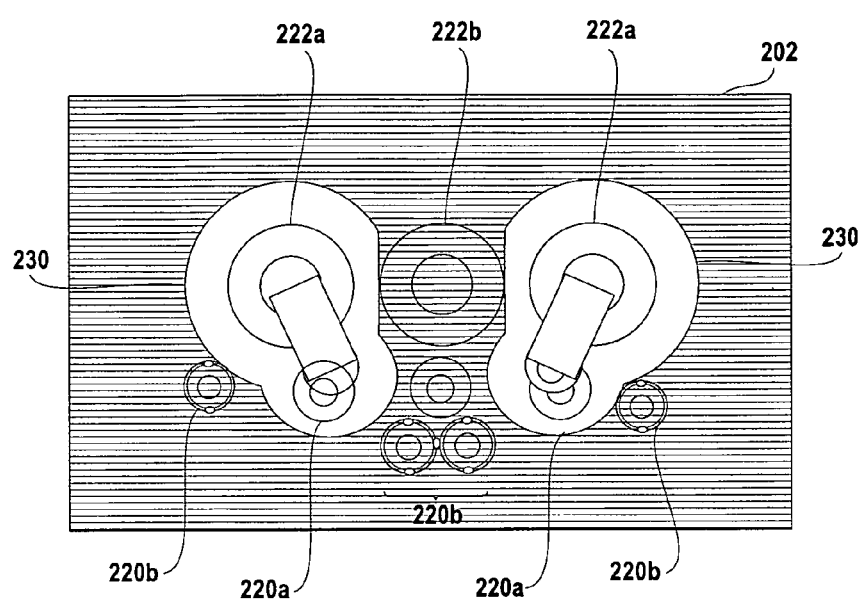
FIG. 4 illustrates a top view of a second conducting layer of a multilayer substrate with a linear configuration in accordance with one embodiment of the present invention.

FIG. 4 illustrates a top view of a second conducting layer of a multilayer substrate with a linear configuration in accordance with one embodiment of the present invention. Another approach to minimizing the amount of cross-talk between each differential pair of plated through holes 222a is to situate a plated through hole providing ground 222b between the differential pair of PTHs 222a such that the center of each plated through hole is aligned in a collinear configuration. Having the ground PTH 222b between the differential pair of PTHs 222a shields each of the differential pair of plated through holes 222a from each other.

As shown from the second conducting layer 202, the three PTH linear configuration minimizes the horizontal space that is needed to achieve the target differential impedance, and thus satisfying the package level differential loss requirement. In one example, a typical value and variation for the acceptable differential impedance is $100\Omega \pm 10\Omega$, including the impedance variation due to process variations. The value and variation of the acceptable differential impedance is for illustrative purposes and is not meant to be limiting. This linear configuration of plated through holes maximizes horizontal differential pair separation for achieving acceptable package level cross-talk performance.

In one embodiment, the second conducting layer 202 with a collinear configuration is implemented using clearance areas 230 directly above the differential pair of plated through holes 222a, as described above. The thickness of the conductive layer is relatively thin compared to the thicknesses of the insulating layers. For this reason, it should be appreciated the removal of relatively thin conductive material to form the clearance areas 230 does not effect the structural integrity of the multilayer substrate. It should be noted for the inline configuration, as illustrated in FIG. 4, the clearance areas 230 are not perfectly round. The shape of the clearance areas 230 on the side closest to the ground PTH has a linear cut to accommodate the ground PTH 222b and preserving the conductive material over the plated through hole providing ground signals 222b.

Figure 5:
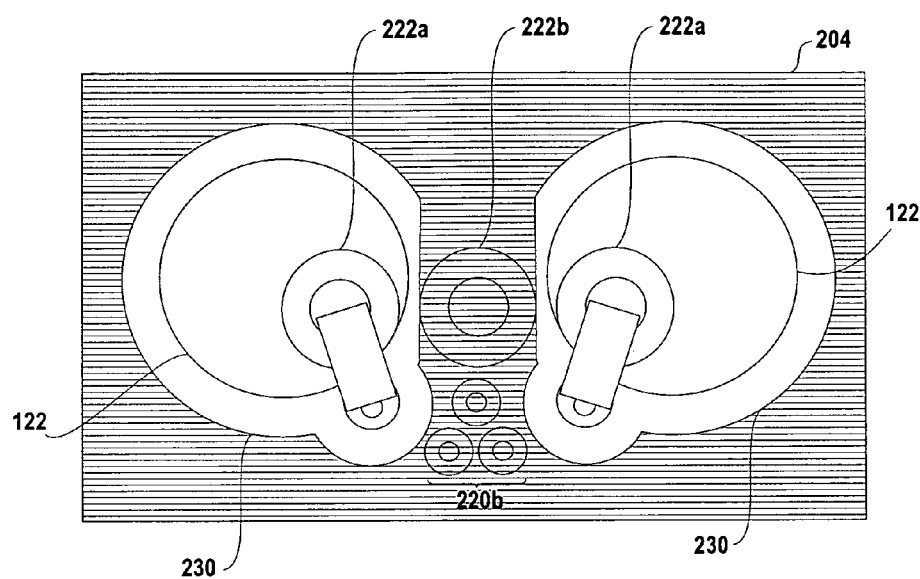
FIG. 5 illustrates a top view of a third conducting layer of a multilayer substrate with a linear configuration in accordance with one embodiment of the present invention.

FIG. 5 illustrates a top view of a third conducting layer of a multilayer substrate with a linear configuration in accordance with one embodiment of the present invention. Aligning the ground PTH 222b and differential PTHs 220b to the middle of the two differential solder balls 122 (shown outlined in FIG. 5), carrying differential signals to the PCB, helps create a smooth impedance transition from the plated through holes 222a to solder balls 122. This smooth impedance transition leads to reduced impedance mismatch, which in turn leads to improved differential loss. In one embodiment, each solder ball 122 of the differential pair is centered underneath one of the differential pairs of plated through holes 222a. That is the axis of each solder ball 122 is aligned with the axis of the corresponding differential pair of PTHs 222a.

Referring to FIG. 3, conductive material above the differential pair of plated through holes 222a is one source of coupling which leads to difficulties in achieving the target differential impedance. Another similar source of coupling arises from conductive material coupling with the differential pair of solder balls 122 providing signals between the printed circuit board and the package. To reduce this coupling, a clearance area 230 free of conductive material in a conductive layer directly above the differential pair of solder balls 122 is defined as illustrated in FIG. 4. In another embodiment, the clearance area 230, implemented in the third conducting layer 206, encompasses one end of each micro-via 220a of a corresponding differential pair of plated through holes 222a. As described previously, the shape of the clearance areas 230 are modified to accommodate the ground PTH 222b and preserve conducting material over the ground PTH 222b.

Figure 6:
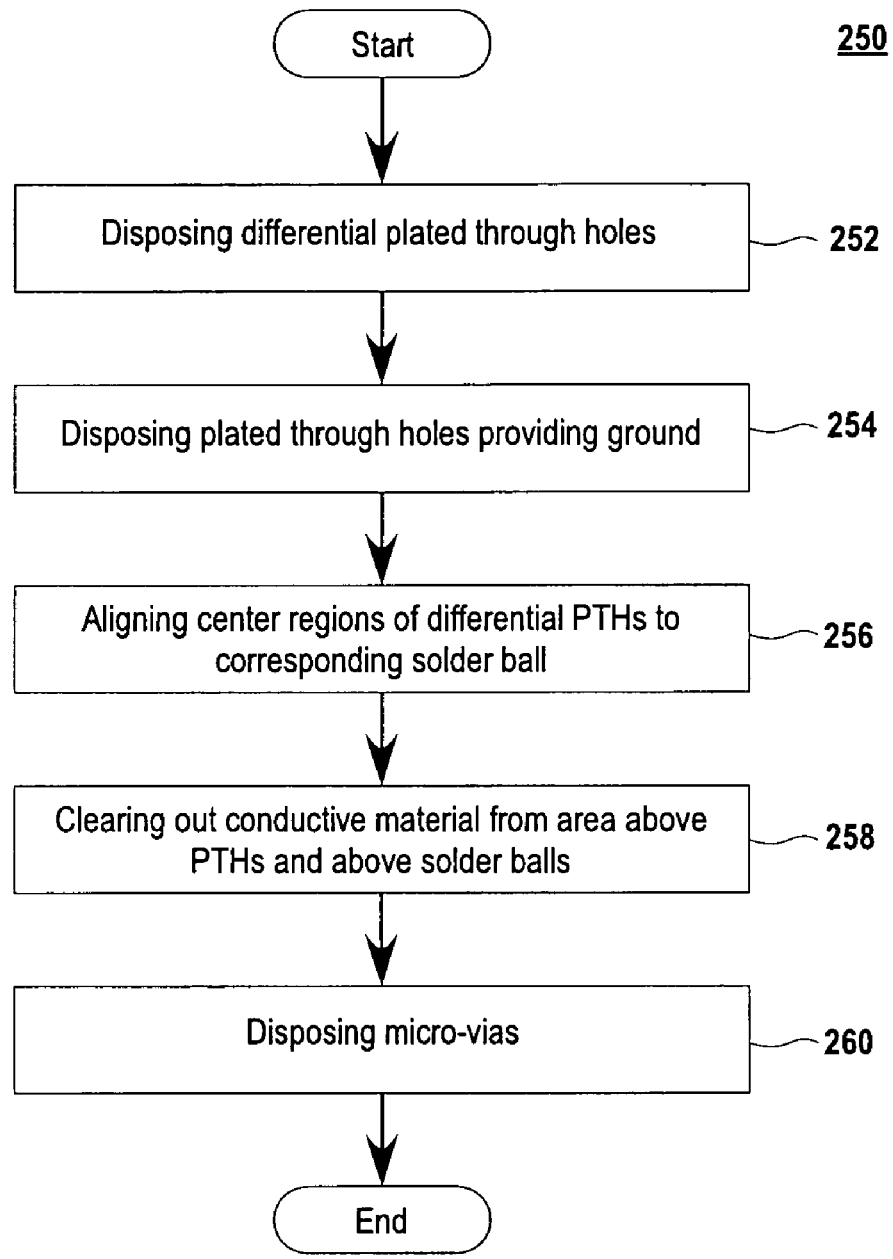
FIG. 6 is a flow chart diagram illustrating method operations for fabricating a multilayer substrate in accordance with one embodiment of the present invention.

FIG. 6 is a flow chart diagram illustrating method operations for fabricating a multilayer substrate in accordance with one embodiment of the present invention. The method 250 begins with operation 252, where the differential pairs of plated through holes for providing differential signals, between two conductive layers separated by a core electrically insulating layer, are disposed on the multilayer substrate. As illustrated in FIG. 1, differential pairs of plated through holes provide electrical communication to signal routing between conducting layers separated by a core insulating layer. In one exemplary embodiment, the plated through holes provide electrical communication between the second and third conductive layer of a four layer substrate.

The method advances to operation 254, where a number of plated through holes for providing ground are disposed on the multilayer substrate, such that a plated through hole providing ground is collinear with each differential pair of plated through holes. That is, the axis of each PTH is collinear. As illustrated in FIG. 4, a PTH providing ground is placed in between a differential pair of plated through holes. In operation 256, center regions of differential pair of plated through holes are aligned to the center of a corresponding solder ball, i.e., the axis of the PTH and the axis of the corresponding solder ball are aligned. The alignment of the center of each differential PTH to the center of one of the differential pair of solder balls is illustrated in the top view of the third conductive layer as shown in FIG. 5.

The method proceeds to operation 258, where electrically conductive material from specified regions of the multilayered substrate is cleared out. A first clearance area is located in the conducting layer directly above the pair of differential plated through holes and encompasses the area of the differential pair of PTHs. In one embodiment, the first clearance area is located on the second conducting layer of a four layer substrate, as illustrated in FIG. 3. A second clearance area is located in the conducting layer directly above the differential pair of solder balls and encompasses the differential pair of solder balls. In another embodiment, the second clearance area is located in the third conducting layer of a four layer substrate, as illustrated in FIG. 5. In operation 260, a number of micro-vias providing electrical communication between conductive layers separated by the buildup insulating layer are disposed on the multilayer substrate. In yet another embodiment, one end of each micro-via providing differential signals is encompassed by the first and second clearance areas.

Figure 7:
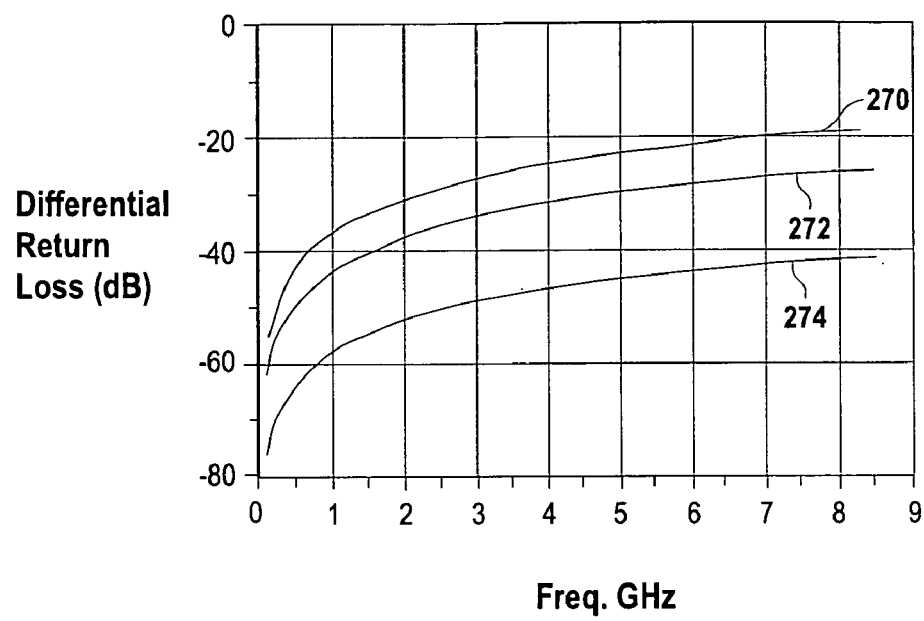
FIG. 7 illustrates a simulation of the differential return loss over a frequency range for different multilayer substrate configurations in accordance with one embodiment of the present invention.

FIG. 7 illustrates a simulation of the differential return loss over a frequency range for different multilayer substrate configurations in accordance with one embodiment of the present invention. The simulated differential return loss for the PTHs arranged in a triangle configuration is illustrated by the line 270 is approximately −25 dB at a frequency of 4 GHz. This can be compared to the simulated differential return loss 272 for the multilayer substrate implementing a diamond configuration, shown in FIG. 3, of approximately −35 dB at 4 GHz. The simulated differential return loss 274 for a collinear configuration implemented on a multilayer substrate, illustrated in FIG. 4, is approximately −45 dB at a frequency of 4 GHz.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A multilayer substrate for reducing differential loss comprising:
    a plurality of alternating electrically conductive and insulating layers disposed over first and second opposing surfaces of a core layer;
    a plurality of pairs of plated through holes extending through the core layer and operable to provide corresponding differential signals between an integrated circuit and a printed circuit board, the plurality of pairs of plated through holes operable to provide electrical communication between conductive layers of the plurality of alternating electrically conductive and insulating layers; and
    a plurality of plated through holes extending through the core layer and operable to provide ground from the printed circuit board to the integrated circuit, wherein one of the plurality of plated through holes providing ground is situated between through holes of each pair of plated through holes such that a center of the one of the plurality of plated through holes and centers of the each pair of plated through holes are aligned in a substantially collinear configuration.

2. The multilayer substrate of claim 1 further comprising:
    a pair of solder balls for providing signals between the printed circuit board and the multilayer substrate, wherein each solder ball is substantially centered underneath the each pair of plated through holes.

3. The multilayer substrate of claim 1 further comprising:
a clearance area free of conductive material in a conductive layer directly below the each pair of plated through holes and directly above the pair of solder balls.

4. The multilayer substrate of claim 1 further comprising:
a clearance area which is free of conductive material, the clearance area defined within a conductive layer directly above the differential pair of plated through holes.

5. The multilayer substrate of claim 4 further comprising:
a plurality of micro-vias providing electrical communication between two conductive layers separated by a buildup insulating layer, wherein one end of each micro-via associated with a plated through hole operable to provide differential signals is encompassed by the clearance area.

6. The multilayer substrate of claim 1 further comprising:
a plurality of signal traces on a top surface of the multilayer substrate package providing horizontal routing of signals between the integrated circuit and the multilayer substrate.

7. The multilayer substrate of claim 1, wherein the core layer includes an insulative material.

8. The multilayer substrate of claim 1, wherein signals between the integrated circuit and the multilayer substrate are provided through a ball grid array.

9. The multilayer substrate of claim 1, wherein the multilayer substrate is integrated into a wirebond package.

10. A multilayer substrate assembly comprising:
a multilayer substrate including:
   a plurality of alternating electrically conductive and insulating layers;
   a plurality of micro-vias providing electrical communication between two conductive layers separated by a buildup electrically insulating layer;
   a plurality of pairs of plated through holes for providing corresponding differential signal pairs between two conductive layers separated by a core insulating layer; and
   a plurality of plated through holes providing ground between two conductive layers separated by the core insulating layer, wherein one of the plurality of plated through holes providing ground is located between each pair of plated through holes for providing corresponding differential signal pairs in a substantially linear configuration.

11. The ball grid array packaging assembly of claim 10 further comprising:
an integrated circuit bump grid array providing electrical communication between the multilayer substrate and an integrated circuit; and
a plurality of solder balls providing electrical communication between the multilayer substrate and a printed circuit board, wherein each solder ball is substantially centered underneath one of the pair of plated through holes for providing corresponding differential signal pairs.

12. The multilayer substrate of claim 11 further comprising:
a clearance area free of conductive material in a conductive layer directly below the pair of plated through holes for providing corresponding differential signal pairs and directly above the plurality of solder balls.

13. The multilayer substrate of claim 10 further comprising:
a clearance area free of conductive material in a conductive layer directly above the pair of plated through holes for providing corresponding differential signal pairs, wherein the clearance area is operable to maintain differential impedance matching.

14. The multilayer substrate of claim 13, wherein one end of each micro-via associated with the pair of plated through holes for providing corresponding differential signal pairs is encompassed by the clearance area.

15. A multilayer substrate fabricated by a process comprising:
disposing forming a plurality of pairs of plated through holes for providing corresponding differential signal pairs between two conductive layers separated by a core insulating layer;
forming a plurality of plated through holes for providing ground between two conductive layers separated by the core insulating layer, wherein one of the plurality of plated through holes providing ground is collinear with one of the pairs of plated through holes providing corresponding differential signal pairs; and
aligning center regions of the one of the pairs of plated through holes providing corresponding differential signal airs and a corresponding solder ball.

16. The multilayer substrate of claim 15 further comprising:
removing electrically conductive material from an area within a conductive layer of the multilayer substrate directly below each through hole of the pairs of plated through holes for providing corresponding differential signal pairs and wherein the conductive layer is directly above a plurality of solder balls.

17. The multilayer substrate of claim 15 further comprising:
removing electrically conductive material from an area within a conductive layer of the multilayer substrate directly above each through hole of the pairs of plated through holes for providing corresponding differential signal pairs.

18. The multilayer substrate of claim 17 further comprising:
forming a plurality of micro-vias providing electrical communication between two conductive layers separated by a buildup electrically insulating layer; and
clearing conductive material from a conductive layer defining an end of each micro-via associated with each through hole of the pairs of plated through holes for providing corresponding differential signal pairs.

19. The multilayer substrate of claim 15 further comprising:
disposing an integrated circuit bump grid array on a surface of the multilayer substrate.

20. The multilayer substrate of claim 15 further comprising:
coupling a plurality of conductive wires originating from an integrated circuit to a surface of the multilayer substrate.

* * * * *